United States Patent
Hsu

(10) Patent No.: US 7,539,022 B2
(45) Date of Patent: May 26, 2009

(54) CHIP EMBEDDED PACKAGING STRUCTURE

(75) Inventor: Shih-Ping Hsu, Taoyuan County (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 471 days.

(21) Appl. No.: 11/163,058

(22) Filed: Oct. 4, 2005

(65) Prior Publication Data

US 2007/0076391 A1    Apr. 5, 2007

(51) Int. Cl.
*H05K 1/18* (2006.01)
(52) U.S. Cl. .................. 361/763; 361/764; 361/765
(58) Field of Classification Search ......... 361/760–766; 257/690–692
See application file for complete search history.

(56) References Cited

U.S. PATENT DOCUMENTS 5,250,843 A * 10/1993 Eichelberger ............... 257/692
5,366,906 A * 11/1994 Wojnarowski et al. ......... 438/17
5,422,513 A * 6/1995 Marcinkiewicz et al. ..... 257/668
5,701,033 A    12/1997 Ueda
6,239,980 B1 * 5/2001 Fillion et al. ................ 361/760

FOREIGN PATENT DOCUMENTS

CN    2613046 Y    4/2004

* cited by examiner

*Primary Examiner*—Tuan T Dinh
(74) *Attorney, Agent, or Firm*—Winston Hsu

(57) ABSTRACT

A chip embedded packaging structure includes a first metal board, a second metal board having at least a through cavity, in which the second metal board is disposed on the upper surface of the first metal board to form a heat dissipating substrate, at least a semiconductor chip and a capacitor chip embedded in the first metal board and embraced in the through cavity of the second metal board, a passive component layer disposed on part of the upper surface of the second metal board, and at least a build-up circuit layer covering the semiconductor chip, the capacitor chip, and the passive component layer and electrically connecting them through a plurality of conductive vias.

9 Claims, 3 Drawing Sheets

CHIP EMBEDDED PACKAGING STRUCTURE

BACKGROUND OF THE INVENTION

1. Field of the Invention

The present invention relates to a chip embedded packaging structure, and more particular to a chip embedded packaging structure containing active and passive chips between a build-up circuit layer and a heat dissipating substrate.

2. Description of the Prior Art

In recent years, as information appliances and communication products develop and the capacity of information transmission expands, the demand for higher signal transmission also increases accordingly. At the same time, under the popularity of hand-held electronic products, the development of semiconductor fabrication processes is moving toward the direction of high capacity, high frequency, low power consumption, and multi-functional integration.

Under the field of IC packaging techniques, the complexity of various types of IC packages including the chip scale package (CSP) and the flip chip (FC) package have also increased significantly to accommodate the increasing demand of high input/output (I/O) values, heat dissipation capability, and reduced packaging size. Additionally, the lamination technique of circuit boards also moves toward the direction of lower thickness, multi-layer, and high wiring density. In order to further reduce the space demand of circuit boards, numerous multi-layer circuit bards including flip chips and passive components such as resistors, capacitors, or inductors have been developed.

Nevertheless, the flip chips and passive components connected to the surface of the multi-layer circuit board still have to be electrically connected via the circuit layer embedded within the circuit board, and overly long distances between a connection will often influence the electrical performance of the device. Hence, how to effectively utilize the space within the multi-layer circuit board to reduce the overall volume of the package, increase the heat dissipating capability of the chip, and reduce the distance between the semiconductor chip and other components, thereby achieving a small size and high performance packaging structure, has become a critical task.

SUMMARY OF THE INVENTION

It is therefore an objective of the present invention to provide a chip embedded packaging structure containing active and passive chips to solve the above-mentioned problems.

According to the present invention, a chip embedded packaging structure comprises: a first metal board; a second metal board disposed on the upper surface of the first metal board, wherein the second metal board further comprises at least a through cavity and forms a heat dissipating substrate with the first metal board; at least a semiconductor chip and at least a capacitor chip embedded in the surface of the first metal board and embraced in the through cavity of the second metal board; a passive component layer disposed on part of the upper surface of the second metal board; and at least a build-up circuit layer disposed on the heat dissipating substrate and covering the semiconductor chip, the capacitor chip, and the passive component layer and electrically connecting them through a plurality of conductive vias.

Overall, the chip embedded packaging structure comprising active or passive chips includes the following advantages:

a) Increases the heat dissipation efficiency of the embedded electronic devices via the heat dissipation substrate.

b) Achieves grounding effect by connecting the active and passive chips to the heat dissipation substrate to increase overall electrical performance and reduce noise.

c) Shortens wiring distance, reduces product size, and increases product performance, thereby achieving multi-functionality by integrating active and passive chips into the substrate and forming an MIM capacitor via the passive component layer.

d) Forms modules and achieves multi-functionalism by disposing an active chip and passive components over the surface of the build-up circuit layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
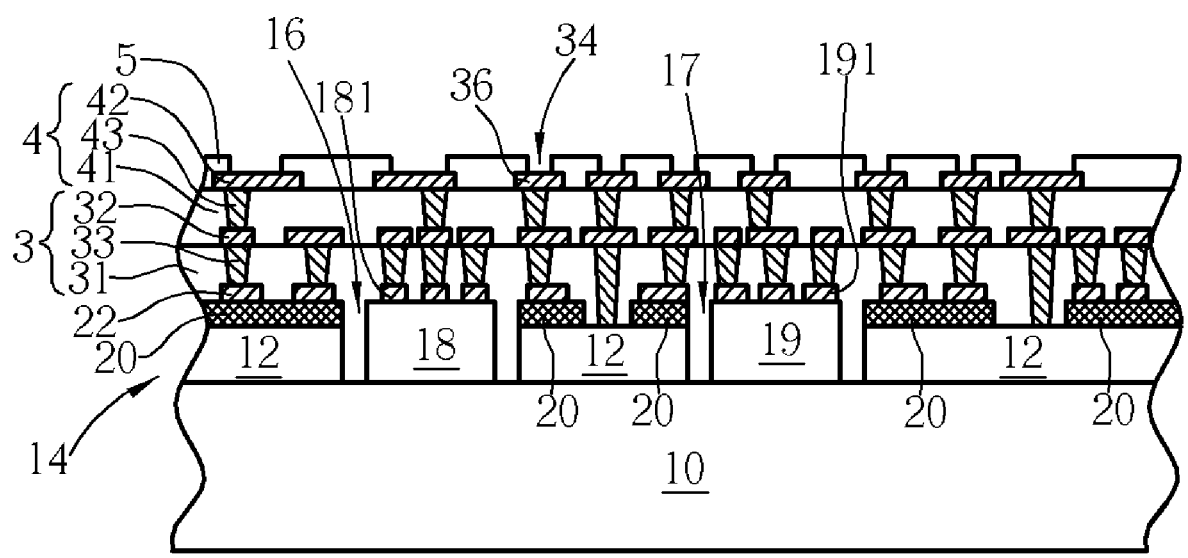
FIG. 1 is a perspective diagram showing the cross section of the chip embedded packaging structure containing embedded active and passive chips according to the preferred embodiment of the present invention.

Please refer to FIG. 1. FIG. 1 is a perspective diagram showing the cross section of the chip embedded packaging structure containing embedded active and passive chips according to the preferred embodiment of the present invention. As shown in FIG. 1, the bottom of the structure includes a first metal board 10, and a second metal board 12 is disposed on the upper surface of the first metal board 10, in which the second metal board 12 and the first metal board 10 together form a heat dissipating substrate 14. Preferably, the second metal board 12 includes at least a through cavity, such as cavity 16 and 17, and the first metal board 10 and the second metal board 12 can be composed of same or different material. For instance, an etching process can be performed to form a cavity with a predetermined depth on a metal board, such as forming the first metal board 10 and the second metal board 12 with a through cavity. Alternatively, a metal layer containing a through cavity can be formed directly on the surface of another metal board, such as forming the heat dissipating substrate 14 structure by disposing the second metal board 12 with a through cavity on the surface of the first metal board 10. Additionally, the first metal board 10 can be a single metal layer or a multi-layer metal-metal or metal-insulator-metal build-up structure, in which materials with adequate conductivity can be utilized in the present invention.

Subsequently, at least a semiconductor chip 18 and a capacitor chip 19 are connected to the first metal board 10 via an adhesive (not shown) and embraced in the through cavity 16 and 17 of the second metal board 12. Preferably, the active surface of the semiconductor chip 18 and the capacitor chip 19 includes a plurality of electrode pads 181 and 191 and the semiconductor chip 18 can be composed of active chips including memories, light emitting devices, and other IC chips. Similar to the semiconductor chip 18 which utilized an adhesive to be fixed on the first metal board 10, another adhesive can be utilized to fix the capacitor chip 19 on the upper surface of the first metal board 10 to reduce the distance of electrical connection extended from the semiconductor chip 18 and the capacitor chip 19 to external device and increase the heat dissipating efficiency of other electronic devices utilized over the surface of the metal board.

Next, a passive component layer 20 is disposed on part of the upper surface of the second metal board 12, in which the passive component layer 20 is composed of a dielectric material layer having high dielectric constant. Preferably, a circuit layer 22 composed of at least a metal layer is disposed over the surface of the dielectric material layer, in which the circuit layer 22, the dielectric material layer, and the second metal board 12 together form a capacitor composed of metal-insulator-metal (MIM) structure. Next, build-up circuit layers 3 and 4 are disposed on the surface of the heat dissipating substrate 14 and covering the semiconductor chip 18, the capacitor chip 19, and the passive component layer 20, in which the build-up circuit layers 3 and 4 also include dielectric layers 31 and 41, circuit layers 32 and 42 formed on the dielectric layers 31 and 41, and conductive vias 33 and 43 formed through the dielectric layers 31 and 41 and connecting to the circuit layers 32 and 42. By utilizing the conductive vias 33 and 43, the build-up circuit layers 3 and 4 are able to electrically connect to the plurality of electrode pads 181 and 191 disposed over the active surface of the semiconductor chip 18 and the capacitor chip 19, the circuit layer 22 above the passive component layer 20, and the second metal board 12 surface. Depending on the design of the product, the heat dissipating substrate 14 can be electrically connected to achieve a grounding effect. Preferably, a solder resist layer 5 is formed on the edge surface of the build-up circuit layer 4 of the heat dissipating substrate 14, in which the solder resist layer 5 further includes a plurality of openings 34 to expose part of the circuit layer 42 to form a plurality of connecting pads 36.

Figure 2:
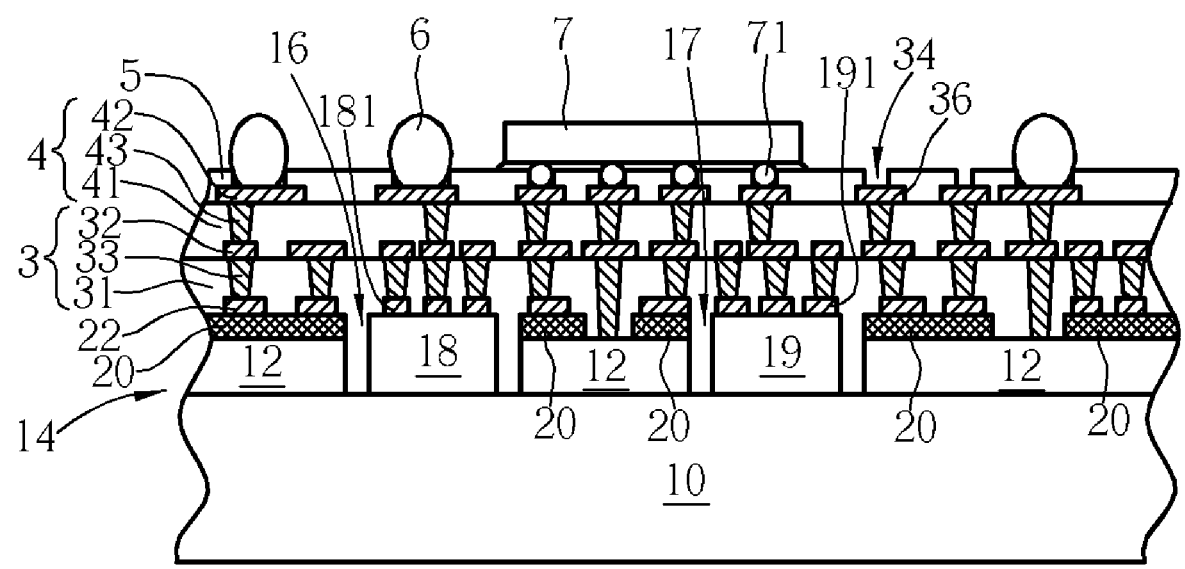
FIG. 2 is a cross diagram showing the structure of the chip embedded packaging structure from FIG. 1 containing a flip chip thereon.

As shown in FIG. 2, the present invention also combines the conventional flip-chip processes to form a solder resist layer 5 on the edge surface of the build-up circuit layer 4. The solder resist layer 5 further includes a plurality of openings 34 to expose part of the circuit layer 42 for serving as a plurality of connecting pads 36 and connecting to a plurality of solder balls and at least an active chip 7. Additionally, the active chip 7 is electrically connected to the connecting pads 36 via a plurality of solder bumps 71, such that the active chip 7 can be further connected to the semiconductor chip 18, the capacitor chip 19, and the passive component layer 20 situated in the package structure. Moreover, the active chip 7 can be electrically connected to the heat dissipating substrate 14 via the build-up circuit layers 3 and 4 for achieving grounding effect.

Figure 3:
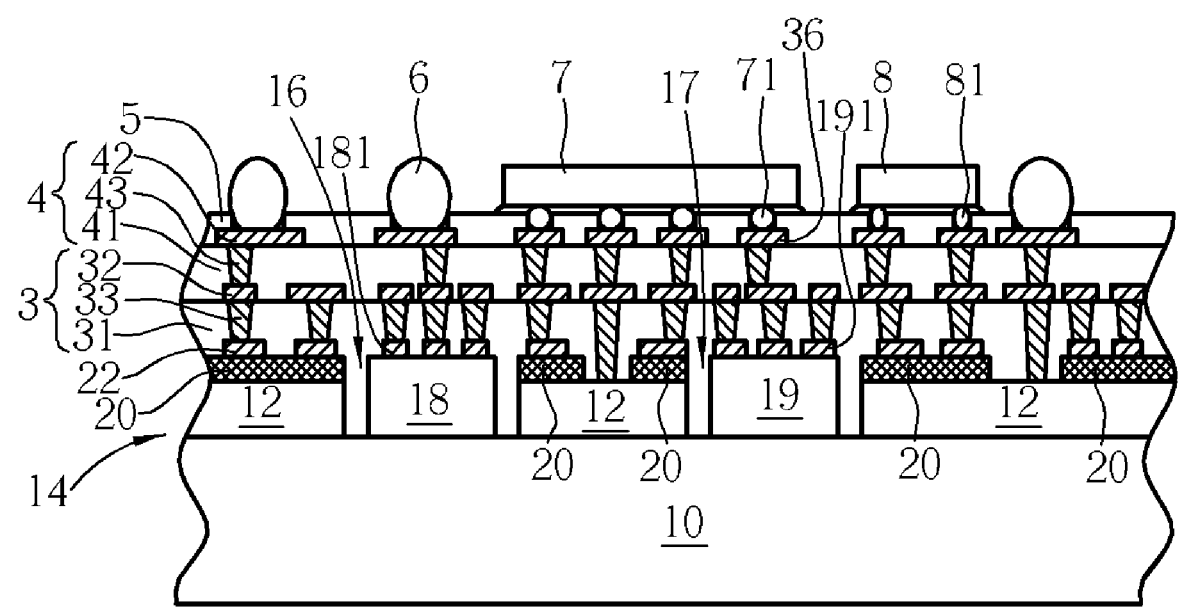
FIG. 3 is a cross diagram showing the structure of the chip embedded packaging structure from FIG. 2 containing passive components thereon.

As shown in FIG. 3, at least a passive component 8 can be disposed on the connecting pads 36, in which the passive component 8 can be a capacitor, an inductor, or a resistor. By utilizing a plurality of solder bumps 81 to electrically connect the passive component 8 to part of the connecting pads 36, the passive component 8 can be further connected to the semiconductor chip 18, the capacitor chip 19, and the passive component layer 20 situated in the package substrate.

Additionally, at least a heat dissipating structure (not shown) can be formed on the surface of the heat dissipating substrate not contacting the build-up circuit layer, in which the heat dissipating structure may include rough surfaces, grooves, indentations, or fin-shaped heat dissipating structures for increasing the dissipating area of the heat dissipating substrate 14.

Overall, the chip embedded packaging structure comprising active or passive chips includes the following advantages:

a) Increases the heat dissipation efficiency of the embedded electronic devices via the heat dissipation substrate.

b) Achieves grounding effect by connecting the active and passive chips to the heat dissipation substrate to increase overall electrical performance and reduce noise.

c) Shortens wiring distance, reduces product size, and increases product performance, thereby achieving multi-functionality by integrating active and passive chips into the substrate and forming an MIM capacitor via the passive component layer.

d) Forms modules and achieves multi-functionalism by disposing an active chip and passive components over the surface of the build-up circuit layer.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A chip embedded packaging structure comprising:
a first metal board;
a second metal board disposed on the upper surface of the first metal board, wherein the second metal board further comprises at least a through cavity and forms a heat dissipating substrate with the first metal board;
at least a semiconductor chip and at least a capacitor chip embedded in the surface of the first metal board and embraced in the through cavity of the second metal board;
a passive component layer disposed on part of the upper surface of the second metal board; and
at least a build-up circuit layer disposed on the heat dissipating substrate and covering the semiconductor chip, the capacitor chip, and the passive component layer, wherein the build-up circuit layer further comprises:
a dielectric layer; at least a circuit layer formed on the dielectric layer, wherein the circuit layer, the passive component layer, and the second metal board comprise a metal-insulator-metal (MIM) capacitor; and a plurality of conductive vias penetrating the dielectric layer for connecting the circuit layer and electrically connecting the build-up circuit layer and the capacitor chip, semiconductor chip, and the passive component layer.

2. The chip embedded packaging structure of claim 1, wherein the semiconductor chip and the capacitor chip further comprise a plurality of electrode pads for forming an active area.

3. The chip embedded packaging substrate of claim 1 further comprising a solder resist layer formed on the edge surface of the build-up circuit layer of the heat dissipating substrate, wherein the solder resist layer further comprises a plurality of openings to expose part of the circuit layer for forming a plurality of connecting pads.

4. The chip embedded packaging substrate of claim 1, wherein the build-up circuit layer is electrically connected to the heat dissipating substrate for achieving grounding effect.

5. The chip embedded packaging substrate of claim 1, wherein the passive component layer is a dielectric material layer comprising a high dielectric constant, wherein at least a circuit layer comprised of a metal layer is disposed on the surface of the dielectric material layer.

6. The chip embedded packaging substrate of claim 1, wherein the surface of the heat dissipating substrate not contacting the build-up circuit layer further comprises a heat dissipating structure.

7. The chip embedded packaging substrate of claim 1, wherein the semiconductor chip and the capacitor chip are electrically connected to the heat dissipating substrate via the build-up circuit layer for achieving grounding effect.

8. The chip embedded packaging substrate of claim 3 further comprising at least an active chip disposed on the edge surface of the build-up circuit layer and electrically connected to part of the connecting pads.

9. The chip embedded packaging substrate of claim 3 further comprising at least a passive component disposed on the edge surface of the build-up circuit layer and electrically connected to part of the connecting pads.

* * * * *